(12) United States Patent
Suzumura et al.

(10) Patent No.: US 12,127,417 B2
(45) Date of Patent: Oct. 22, 2024

(54) SENSOR DEVICE

(71) Applicant: Japan Display Inc., Tokyo (JP)

(72) Inventors: Isao Suzumura, Tokyo (JP); Takumi Sano, Tokyo (JP)

(73) Assignee: Japan Display Inc., Tokyo (JP)

( * ) Notice: Subject to any disclaimer, the term of this patent is extended or adjusted under 35 U.S.C. 154(b) by 371 days.

(21) Appl. No.: 17/732,666

(22) Filed: Apr. 29, 2022

(65) Prior Publication Data

US 2022/0359843 A1 Nov. 10, 2022

(30) Foreign Application Priority Data

May 10, 2021 (JP) .................................. 2021-079733

(51) Int. Cl.
*H10K 30/88* (2023.01)
*H10K 30/82* (2023.01)
*H10K 39/30* (2023.01)
*H10K 77/10* (2023.01)

(52) U.S. Cl.
CPC ............. *H10K 30/88* (2023.02); *H10K 39/30* (2023.02); *H10K 30/82* (2023.02); *H10K 77/111* (2023.02)

(58) Field of Classification Search
CPC ........ H10K 30/88; H10K 39/30; H10K 30/82; H10K 77/111; H10K 39/32; Y02E 10/549; G01D 5/26
See application file for complete search history.

(56) References Cited

U.S. PATENT DOCUMENTS

| | | | |
|---|---|---|---|
| 2017/0003440 A1 | 1/2017 | Kim et al. | |
| 2021/0233993 A1* | 7/2021 | Kim .................. | H10K 59/1275 |
| 2022/0039248 A1* | 2/2022 | Sano ...................... | H05K 1/189 |
| 2022/0190038 A1 | 6/2022 | Tada et al. | |
| 2022/0320223 A1* | 10/2022 | Wang .................... | H10K 59/131 |
| 2022/0320259 A1* | 10/2022 | Sano ..................... | H10K 77/111 |
| 2022/0416182 A1* | 12/2022 | Sano ..................... | H10K 59/131 |
| 2023/0075199 A1* | 3/2023 | Tian ....................... | H10K 59/19 |
| 2023/0109049 A1* | 4/2023 | Wang ....................... | B32B 3/30 |
| | | | 361/807 |

FOREIGN PATENT DOCUMENTS

| | | |
|---|---|---|
| JP | 2017-113088 A | 6/2017 |
| WO | WO2021/049262 A1 | 3/2021 |

OTHER PUBLICATIONS

Office Action issued in related German Patent Application No. 10 2022 204 269.7, mailed on Jun. 12, 2024 and English translation of same. 12 pages.

\* cited by examiner

*Primary Examiner* — J. E. Schoenholtz

(74) *Attorney, Agent, or Firm* — K&L Gates LLP

(57) ABSTRACT

According to one embodiment, a sensor device includes an insulating base including a meandering strip-shaped portion and an island-shaped portion, a first inorganic insulating film on the island-shaped portion, a first wiring layer on the first inorganic insulating film, a second inorganic insulating film on the first wiring layer, a second wiring layer on the second inorganic insulating film, an organic insulating film on the second wiring layer, a barrier film covering the organic insulating film, a sensor element on the barrier film, and a sealing film covering the sensor element. The barrier film covers side surfaces of the organic insulating film, and the sealing film is in contact with the barrier film and the second inorganic insulating film.

6 Claims, 9 Drawing Sheets

SENSOR DEVICE

CROSS-REFERENCE TO RELATED APPLICATIONS

This application is based upon and claims the benefit of priority from Japanese Patent Application No. 2021-079733, filed May 10, 2021, the entire contents of which are incorporated herein by reference.

FIELD

Embodiments described herein relate generally to a sensor device.

BACKGROUND

In recent years, the use of flexible substrates with flexibility and elasticity has been proposed in various fields. For example, a flexible substrate with electrical elements arranged in a matrix can be attached to a curved surface such as the chassis of an electronic device or the human body. For example, various sensors, such as touch sensors and temperature sensors, and display elements can be applied as electrical elements.

In a flexible substrate, it is necessary to take measures to prevent the wiring from being damaged by stress caused by bending and stretching. For example, it has been proposed that the wiring be made into a meandering shape as such a measure.

DETAILED DESCRIPTION

Figure 1:
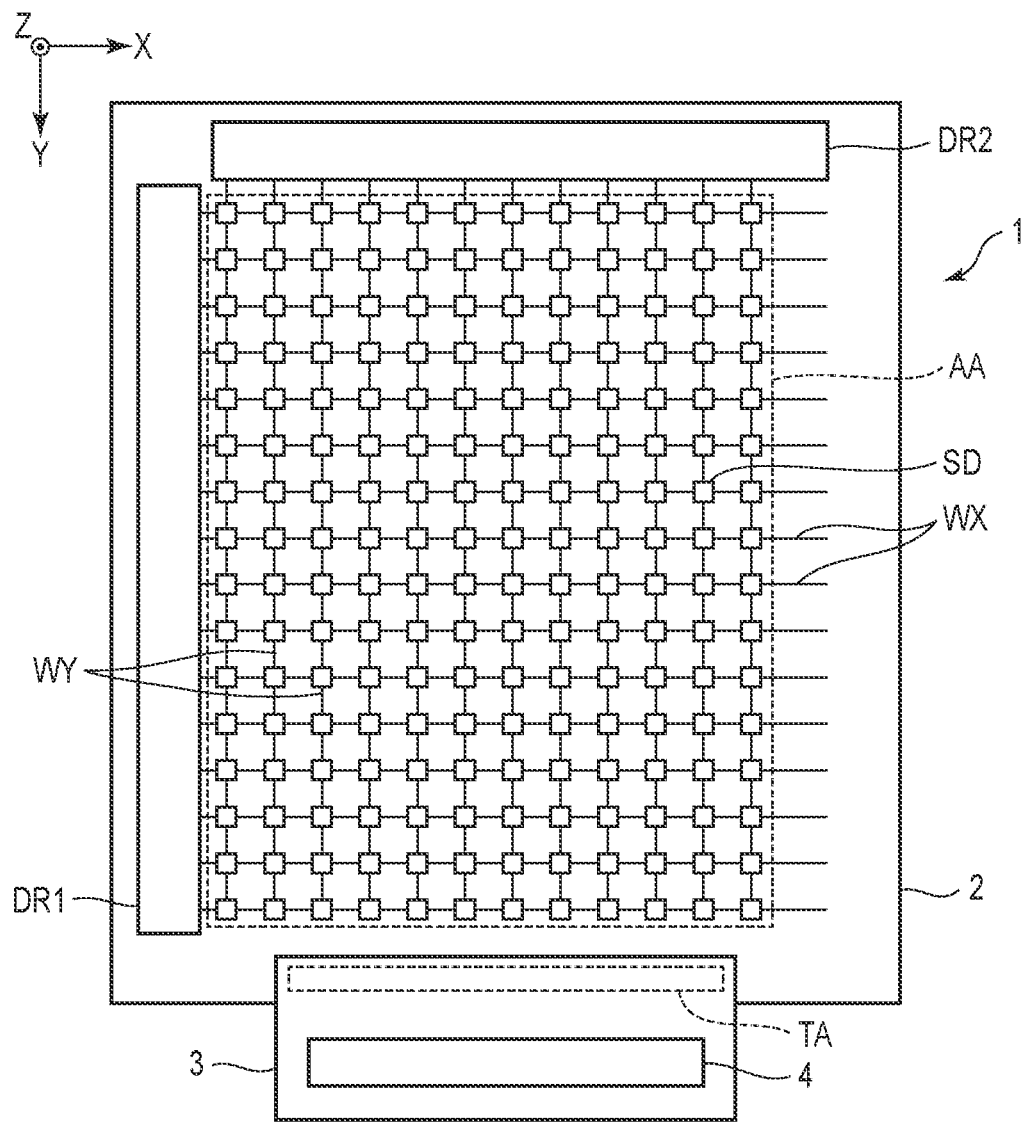
FIG. 1 is a plan view schematically showing a sensor device 1 according to an embodiment.

In general, according to one embodiment, a sensor device includes: an insulating base including a meandering strip-shaped portion and an island-shaped portion connected to the strip-shaped portion; a first inorganic insulating film disposed on the island-shaped portion; a first wiring layer disposed on the first inorganic insulating film; a second inorganic insulating film disposed on the first wiring layer; a second wiring layer disposed on the second inorganic insulating film; an organic insulating film disposed on the second wiring layer; a barrier film formed of an inorganic insulating material and covering the organic insulating film; a sensor element disposed on the barrier film; and a sealing film formed of an inorganic insulating material and covering the sensor element, wherein the sensor element is an organic photodiode, the barrier film covers side surfaces of the organic insulating film, and the sealing film is in contact with the barrier film and the second inorganic insulating film outside the sensor element.

According to one embodiment, a sensor device capable of suppressing reduction in reliability can be provided.

One of embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

FIG. 1 is a schematic plan view showing a sensor device 1 according to the embodiment. In the embodiment, a first direction X, a second direction Y, and a third direction Z are defined as illustrated in the figure. The first direction X, the second direction Y, and the third direction Z are orthogonal to each other, but may cross each other at an angle other than 90 degrees. The first direction X and the second direction Y correspond to, for example, directions parallel to a main surface of a sensor device 1, and the third direction Z corresponds to a thickness direction of the sensor device 1.

The sensor device 1 comprises a flexible substrate 2, a circuit board 3, and a controller 4. The circuit board 3 is, for example, a flexible printed circuit board and is electrically connected to each terminal in a terminal area TA of the flexible substrate 2. The controller 4 is mounted on the circuit board 3, but may be mounted on the flexible substrate 2.

The flexible substrate 2 is configured to be flexible and stretchable as a whole. The flexible substrate 2 comprises a first driver DR1, a second driver DR2, X wirings WX, Y wirings WY, sensor elements SD, and the like.

The first driver DR1 and the second driver DR2 are disposed on, for example, the flexible substrate 2 but may be disposed on the circuit board 3, the controller 4 or the other substrate. The X wirings WX are generic names of wirings extending substantially along the first direction X, and at least several X wirings WX are electrically connected to the first driver DR1. A plurality of X wirings WX are arranged in the second direction Y. The Y wirings WY are generic names of wirings extending substantially along the second direction Y, and at least several Y wirings WY are electrically connected to the second driver DR2. A plurality of Y wirings WY are arranged in the first direction X. These X wirings WX and the Y wirings WY include a plurality of types of wirings such as scanning lines, signal lines, power lines, and various control lines.

A plurality of sensor elements SD are arrayed in a matrix in the first direction X and the second direction Y in an effective area AA, and are electrically connected to the X wirings WX and the Y wirings WY.

The flexible substrate 2 comprises an insulating base 10 which will be described later. For example, all the first driver DR1, the second driver DR2, the X wirings WX, the Y wirings WY, and the sensor elements SD are disposed on the insulating base 10.

Figure 2:
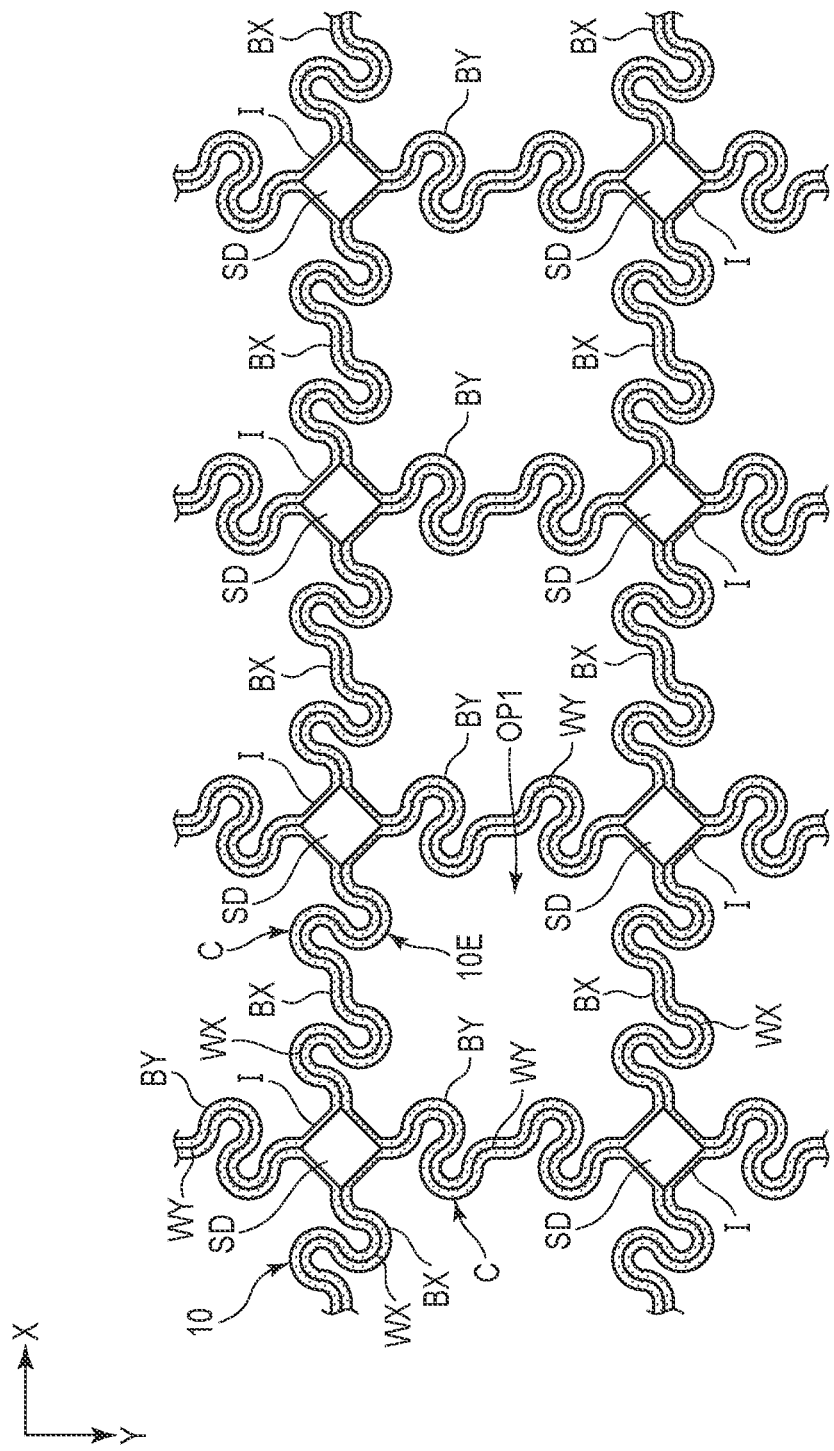
FIG. 2 is a plan view showing an example of a flexible substrate 2.

FIG. 2 is a plan view showing an example of a flexible substrate 2.

The insulating base 10 is stretchable. Being stretchable indicates a property of expanding and contracting, i.e., a property capable of expanding in a non-expanding state that is a normal state and restoring when released in the expanding state. The non-expanding state indicates a state in which a tensile stress is not added.

The insulating base 10 is formed in, for example, a mesh form. In other words, the insulating base 10 includes a plurality of strip-shaped portions BX formed substantially along the first direction X, a plurality of strip-shaped portions BY formed substantially along the second direction Y, and a plurality of island-shaped portions I. The plurality of strip-shaped portions BX are arranged in the second direction Y, and the plurality of strip-shaped portions BY are arranged in the first direction X. Each of the strip-shaped portions BX and BY is stretchable. For example, the strip-shaped portions BX and BY meander. The island-shaped portions I correspond to intersections of the strip-shaped portions BX and the strip-shaped portions BY.

A plurality of island-shaped portions I are arrayed in a matrix in the first direction X and the second direction Y. The island-shaped portions I adjacent in the first direction X are connected by the strip-shaped portions BX, and the island-shaped portions I adjacent in the second direction Y are connected by the strip-shaped portions BY. The shape of the island-shaped portions I may be a quadrangle such as a square, a rectangle or a rhombus, the other polygon, or the other shape such as a circle or an ellipse. The strip-shaped portions BX and BY may be connected to corners of the island-shaped portions I or sides of the island-shaped portions I.

In other words, the insulating base 10 include a plurality of first openings (through holes) OP1. The plurality of first openings OP1 are arrayed in a matrix in the first direction X and the second direction Y. One first opening OP1 is surrounded by an outer edge 10E of the insulating base 10 in planar view. Alternatively, one first opening OP1 is surrounded by two strip-shaped portions BX adjacent in the second direction Y and two strip-shaped portions BY adjacent in the first direction X.

The strip-shaped portion BY is located between the two first openings OP1 adjacent in the first direction X. The strip-shaped portion BX is located between the two first openings OP1 adjacent in the second direction Y. The shape of each of the first openings OP1 is substantially the same.

Each of the strip-shaped portions BX and BY includes one or more curved portions C. Such a shape is often referred to as a meander pattern. However, the shapes of the strip-shaped portions BX and BY are not limited to the example in FIG. 2. The shapes of the strip-shaped portions BX and BY may be the same as each other or different from each other.

The insulating base 10 is formed of, for example, polyimide. The material of the insulating base 10 is not limited to polyimide, but other resin materials can also be used.

The X wirings WX are disposed on the strip-shaped portions BX and meander similarly to the strip-shaped portions BX. The Y wirings WY are disposed on the strip-shaped portions BY and meander similarly to the strip-shaped portions BY.

The sensor elements SD are disposed on the island-shaped portions I and electrically connected to the X wirings WX and the Y wirings WY. For example, one sensor element SD is disposed on one island-shaped portion I, but a plurality of sensor elements SD may be disposed on one island-shaped portion I. The sensor element SD is a photoelectric conversion element or an optical sensor which receives light and outputs an electric signal. In the embodiment, the sensor element SD is, for example, an organic photodiode comprising an organic photoelectric conversion layer. The sensor element SD may be the other element such as an inorganic photodiode.

Figure 3:
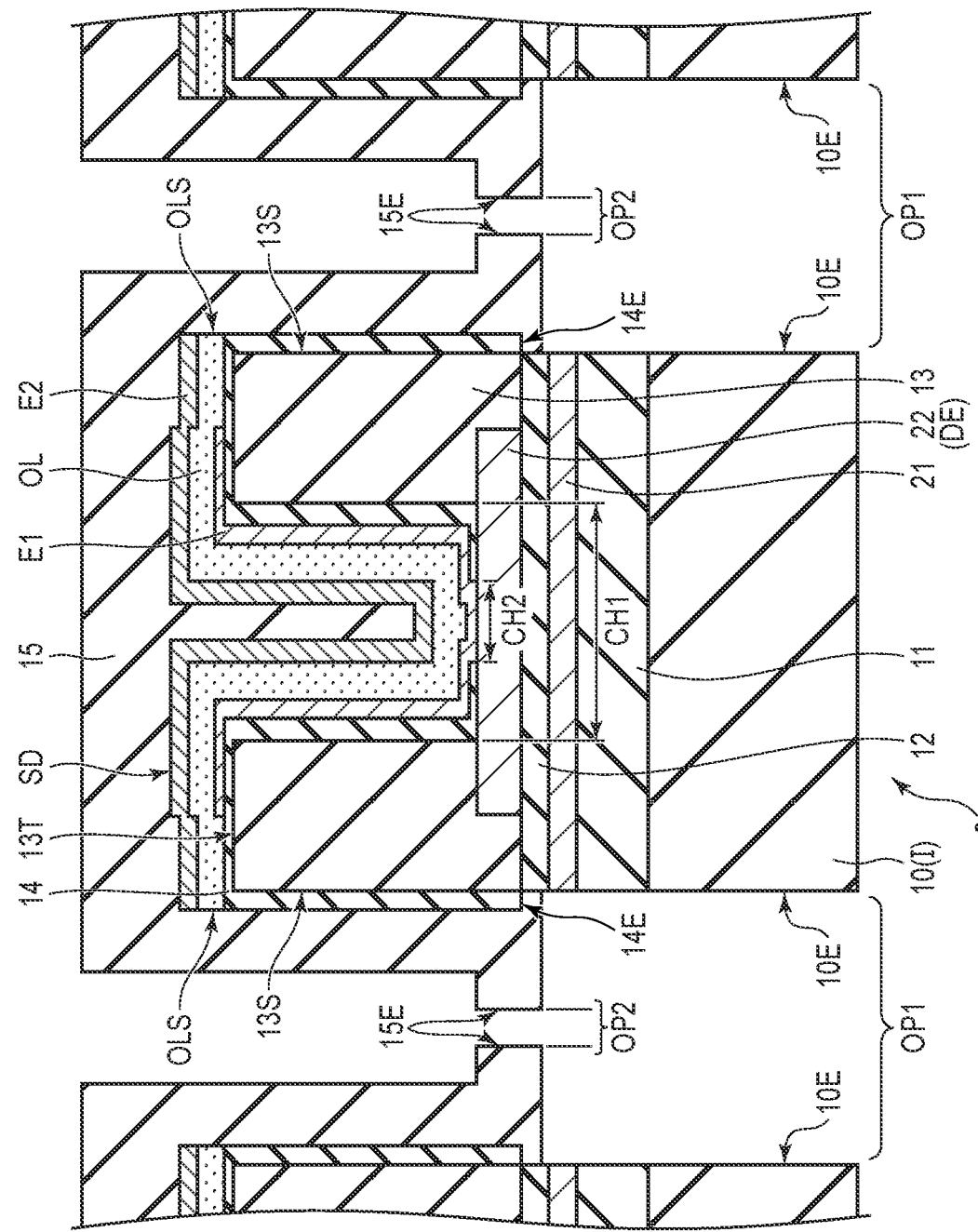
FIG. 3 is a cross-sectional view showing an example of the flexible substrate 2 including the island-shaped portion I.

FIG. 3 is a cross-sectional view showing an example of the flexible substrate 2 including the island-shaped portion I.

The flexible substrate 2 comprises an insulating base 10, a first inorganic insulating film 11, a first wiring layer 21, a second inorganic insulating film 12, a second wiring layer 22, an organic insulating film 13, a barrier film 14, the sensor element SD, and a sealing film 15. The insulating base 10 shown in the figure corresponds to the island-shaped portion I shown in FIG. 2.

The entire flexible substrate 2 may be covered with a protective film having elasticity. Although the protective film is not illustrated in the figure, a back surface of the insulating base 10 and a front surface of the sealing film 15 may be covered with the protective film.

The first inorganic insulating film 11 is disposed on the insulating base 10 or the island-shaped portion I. The first wiring layer 21 is disposed on the first inorganic insulating film 11. The second inorganic insulating film 12 is disposed on the first wiring layer 21. The second wiring layer 22 is disposed on the second inorganic insulating film 12.

Each of the first inorganic insulating film 11 and the second inorganic insulating film 12 is formed as a multilayer body formed by stacking a plurality of insulating layers. For example, each of the first inorganic insulating film 11 and the second inorganic insulating film 12 includes a silicon nitride layer and a silicon oxide layer. The first inorganic insulating film 11 and the second inorganic insulating film 12 may be single-layer bodies.

The first wiring layer 21 is electrically connected to either of the X wiring WX and the Y wiring WY shown in FIG. 2. The second wiring layer 22 is electrically connected to the other of the X wiring WX and the Y wiring WY. For example, the first wiring layer 21 is electrically connected to the X wiring WX and includes a gate electrode of a switching element. The second wiring layer 22 includes a source electrode and a drain electrode of the switching element, the source electrode is electrically connected to the Y wiring WY, and the drain electrode is electrically connected to the sensor element SD. The second wiring layer 22 in the figure corresponds to a drain electrode DE.

The organic insulating film 13 is disposed on the second inorganic insulating film 12 and the second wiring layer 22, and includes a contact hole CH1 that penetrates to the drain electrode DE. The barrier film 14 covers the entire organic insulating film 13. In other words, the barrier film 14 covers not only an upper surface 13T but also the side surfaces 13S of the organic insulating film 13. The barrier film 14 includes a contact hole CH2 that penetrates to the drain electrode DE, in the contact hole CH1.

The barrier film 14 is an inorganic insulating film and is formed of, for example, inorganic insulating materials such as silicon nitride and aluminum oxide. Since such a barrier film 14 covers the entire organic insulating film 13, entry of moisture into the organic insulating film 13 or diffusion of moisture contained in the organic insulating film 13 is suppressed.

The sensor element SD is disposed on the barrier film 14. The sensor element SD comprises a lower electrode E1, an upper electrode E2, and an organic photoelectric conversion layer OL. Either of the lower electrode E1 and the upper electrode E2 functions as an anode of the sensor element SD, and the other functions as a cathode of the sensor element SD.

The lower electrode E1 is located directly above the upper surface 13T, disposed on the barrier film 14 and is in contact with the barrier film 14. In addition, the lower electrode E1 is in contact with the drain electrode DE in the contact holes CH1 and CH2. The lower electrode E1 is patterned for each sensor element SD (or each island-shaped portion I).

Such a lower electrode E1 is formed of a transparent conductive material such as indium tin oxide or indium zinc oxide, or a metallic material such as silver, titanium, or aluminum. The lower electrode E1 may be any one of a single-layer body of a transparent conductive material, a single-layer body of a metallic material, or a multilayer body of a transparent conductive material layer and a metallic material layer.

The organic photoelectric conversion layer OL is disposed on the lower electrode E1 and is in contact with the lower electrode E1. In addition, the organic photoelectric conversion layer OL extends to the outside the lower electrode E1, at a position directly above the upper surface 13T, and is in contact with the barrier film 14. The organic photoelectric conversion layer OL includes an active layer, in addition, may also include a hole transport layer and an electron transport layer.

The upper electrode E2 is disposed on the organic photoelectric conversion layer OL and is in contact with the organic photoelectric conversion layer OL. The upper electrode E2 extends not only to the island-shaped portion I but also to the strip-shaped portion and is integrally formed with the upper electrode E2 of the adjacent sensor element SD, which will be described later. In other words, the upper electrode E2 is a common electrode disposed across a plurality of sensor elements SD. The upper electrode E2 is formed of, for example, a transparent conductive material such as indium tin oxide or indium zinc oxide.

The sealing film 15 covers the sensor element SD. In other words, the sealing film 15 covers the upper electrode E2 and is in contact with the side surfaces OLS of the organic photoelectric conversion layer OL. In addition, the sealing film 15 is in contact with the barrier film 14 outside the sensor element SD. In other words, the sealing film 15 covers a portion of the barrier film 14, which is in contact with the side surfaces 13S, and also covers edge portions 14E of the barrier film 14. The sealing film 15 is in contact with the second inorganic insulating film 12 exposed from the barrier film 14. In the example illustrated in the figure, the sealing film 15 is not in contact with the insulating base 10, the first inorganic insulating film 11, or the first wiring layer 21.

Furthermore, the sealing film 15 includes a second opening (through hole) OP2 which overlaps the first opening OP1 of the insulating base 10. The second opening OP2 is surrounded by outer edges 15E of the sealing film 15.

The sealing film 15 is an inorganic insulating film and is formed of, for example, an inorganic insulating material such as silicon nitride or aluminum oxide. For example, the sealing film 15 is formed of the same material as the barrier film 14. For this reason, high degree of close contact between the barrier film 14 and the sealing film 15 and a high sealing performance can be achieved.

As described above, the sensor element SD is an organic photodiode and comprises an organic photoelectric conversion layer OL. Since the barrier film 14, which is formed as a base for the sensor element SD, covers the entire organic insulating film 13, entry of moisture from the organic insulating film 13 to the sensor element SD is suppressed. In addition, the sensor element SD is sealed by the sealing film 15. For this reason, the sensor element SD is not exposed to the outside air, and entry of moisture into the sensor element SD is suppressed. Therefore, degradation of the sensor element SD, especially the organic photoelectric conversion layer OL, caused by outside air and moisture is suppressed. For this reason, the reduction in reliability can be suppressed.

Figure 4:
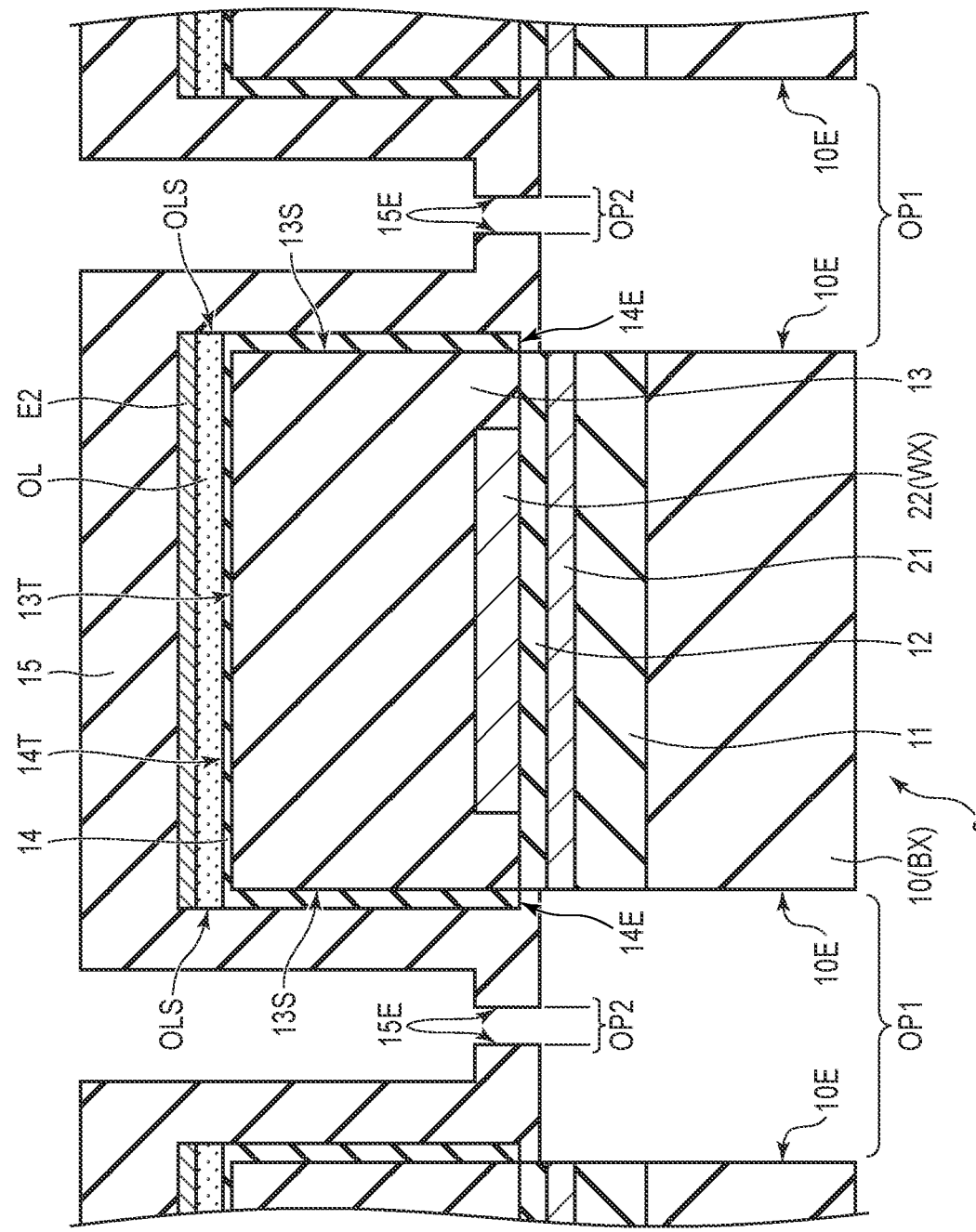
FIG. 4 is a cross-sectional view showing an example of the flexible substrate 2 including the strip-shaped portion BX.

FIG. 4 is a cross-sectional view showing an example of the flexible substrate 2 including the strip-shaped portion BX. In FIG. 4, the cross-section including the strip-shaped portion BX is described, but the cross-section including the strip-shaped portion BY is configured similarly to the cross-section including the strip-shaped portion BX, which will not be described below.

The first inorganic insulating film 11, the second inorganic insulating film 12, the organic insulating film 13, the barrier film 14, and the sealing film 15 extend to the strip-shaped portion BX of the insulating base 10. In addition, in the example illustrated in the figure, the first wiring layer 21 is disposed between the first inorganic insulating film 11 and the second inorganic insulating film 12, and the second wiring layer 22 is disposed between the second inorganic insulating film 12 and the organic insulating film 13.

In other words, the first inorganic insulating film 11 is disposed on the strip-shaped portion BX of the insulating base 10, the first wiring layer 21 is disposed on the first inorganic insulating film 11, the second inorganic insulating film 12 is disposed on the first wiring layer 21, the second wiring layer 22 is disposed on the second inorganic insulating film 12, and the organic insulating film 13 is disposed on the second inorganic insulating film 12 and the second wiring layer 22. In addition, the barrier film 14 covers the entire organic insulating film 13 including the upper surface 13T and the side surfaces 13S.

The lower electrode E1 or the conductive layer in the same layer as the lower electrode E1 is not disposed directly above the strip-shaped portion BX.

The organic photoelectric conversion layer OL and the upper electrode E2 extend directly above the strip-shaped portion BX. In other words, the organic photoelectric conversion layer OL and the upper electrode E2 extend above the barrier film 14 overlapping the strip-shaped portion BX. The organic photoelectric conversion layer OL is in contact with substantially the entire upper surface 14T of the barrier film 14. The upper electrode E2 overlaps substantially the entire organic photoelectric conversion layer OL.

The sealing film 15 covers the upper electrode E2 and is in contact with the side surfaces OLS of the organic photoelectric conversion layer OL. In addition, the sealing film 15 is in contact with the barrier film 14 outside the organic photoelectric conversion layer OL. The sealing film 15 is in contact with the second inorganic insulating film 12 exposed from the barrier film 14.

In the cross section including the strip-shaped portion BX shown in FIG. 4, one of the first wiring layer 21 and the second wiring layer 22 may be omitted. At least one of the first wiring layer 21 and the second wiring layer 22 constitutes the X wiring WX disposed above the strip-shaped portion BX. Although not illustrated in the figure, at least one of the first wiring layer 21 and the second wiring layer 2 constitutes the Y wiring WY disposed above the strip-shaped portion BY, in the cross section including the strip-shaped portion BY.

Figure 5:
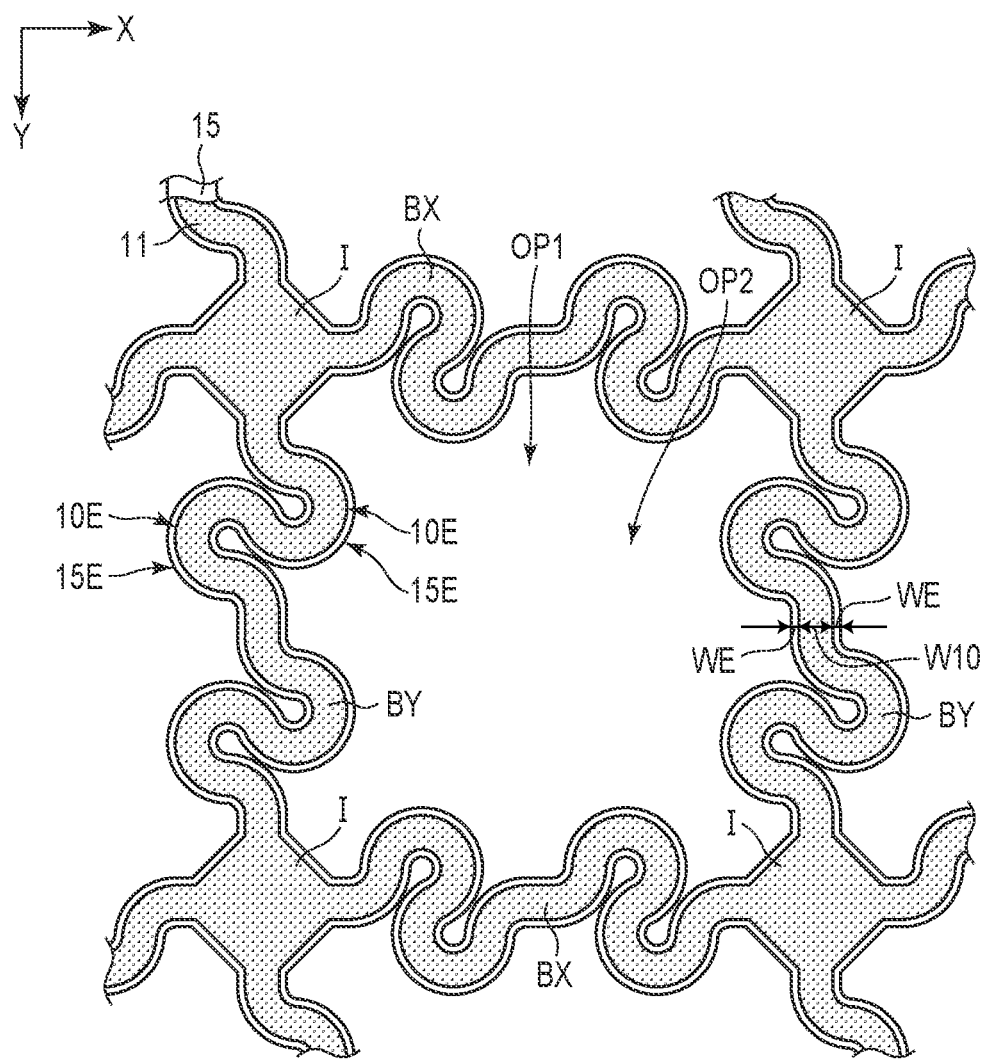
FIG. 5 is an enlarged plan view showing parts of the insulating base 10 and the sealing film 15.

FIG. 5 is an enlarged plan view showing parts of the insulating base 10 and the sealing film 15.

In planar view, the second opening OP2 surrounded by the outer edge 15E of the insulating film 15 overlaps the first opening OP1 surrounded by the outer edge 10E of the insulating base 10. In addition, the sealing film 15 is formed to be wider than the insulating base 10, and the area of the second opening OP2 is smaller than the area of the first opening OP1. In other words, in planar view, the outer edge 10E overlaps the sealing film 15, and the outer edge 15E overlaps the first opening OP1. A width WE from the outer edge 10E to the outer edge 15E is smaller than a width W10 of the insulating base 10, for example, 2.5 µm or more. The width WE is substantially equal on both sides sandwiching the insulating base 10.

Next, a method of manufacturing the above-described flexible substrate 2 will be described with reference to FIG. 6 to FIG. 9.

Figure 6:
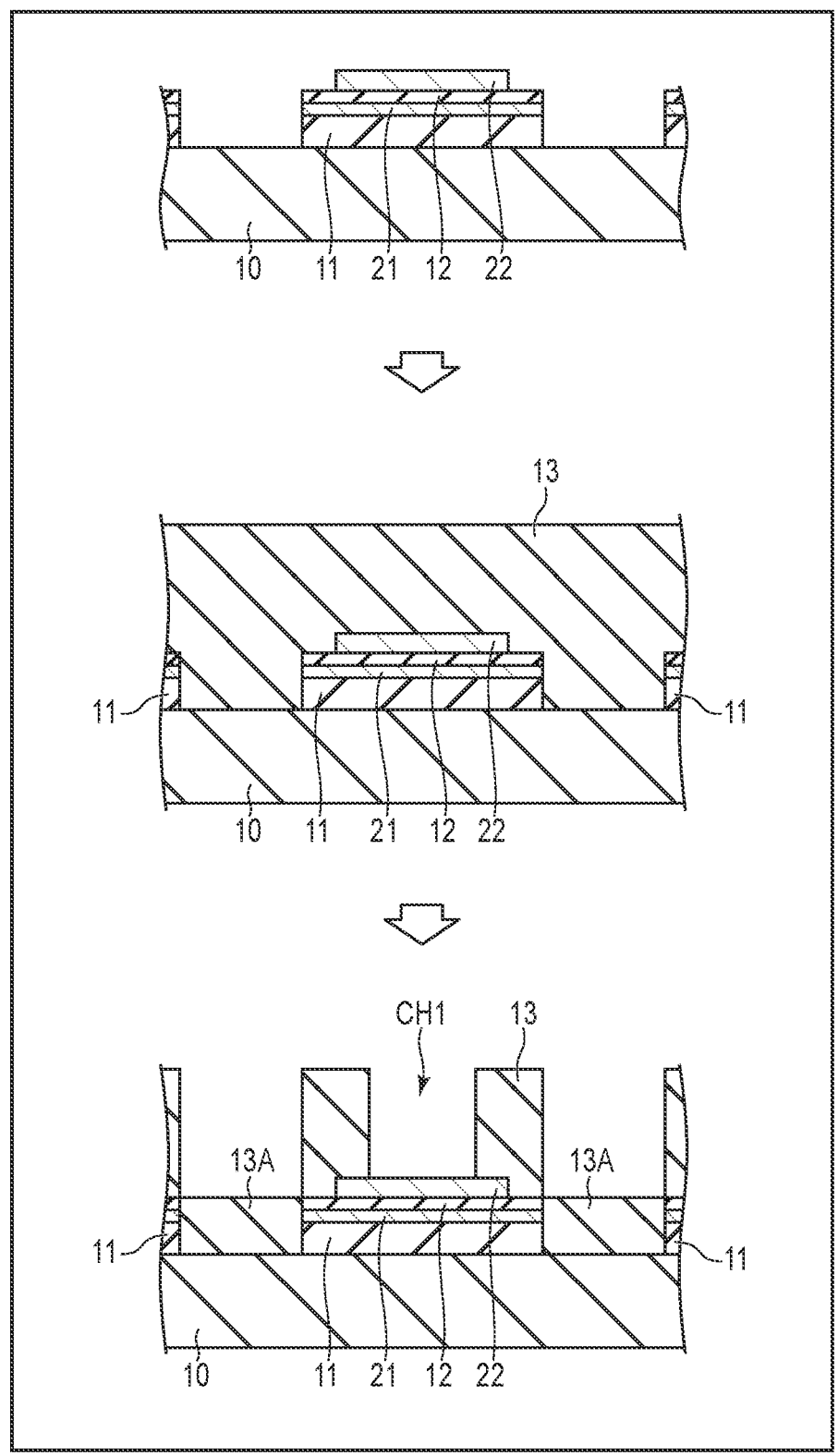
FIG. 6 is a diagram illustrating a method of manufacturing the flexible substrate 2.

First, in an upper part of FIG. 6, for example, the first inorganic insulating film 11 is formed on the insulating base 10 formed of polyimide, the first wiring layer 21 patterned in a predetermined shape is formed on the first inorganic insulating film 11, the second inorganic insulating film 12 is formed, and the second wiring layer 22 patterned in the predetermined shape is formed on the second inorganic insulating film 12. Patterning the first inorganic insulating film 11 and the second inorganic insulating film 12 may be performed together or performed individually.

After that, the organic insulating film 13 is formed over the entire surface as shown in a middle part of the figure. At this time, the organic insulating film 13 is also disposed between the adjacent first inorganic insulating films 11 and is in contact with the insulating base 10.

After that, the organic insulating film 13 patterned in a predetermined shape is formed as shown in a lower part of the figure. When patterning the organic insulating film 13, the contact hole CH1 penetrating to the second wiring layer 22 (or the drain electrode) is formed. At this time, the organic insulating film 13A is partially left between the adjacent first inorganic insulating films 11.

Figure 7:
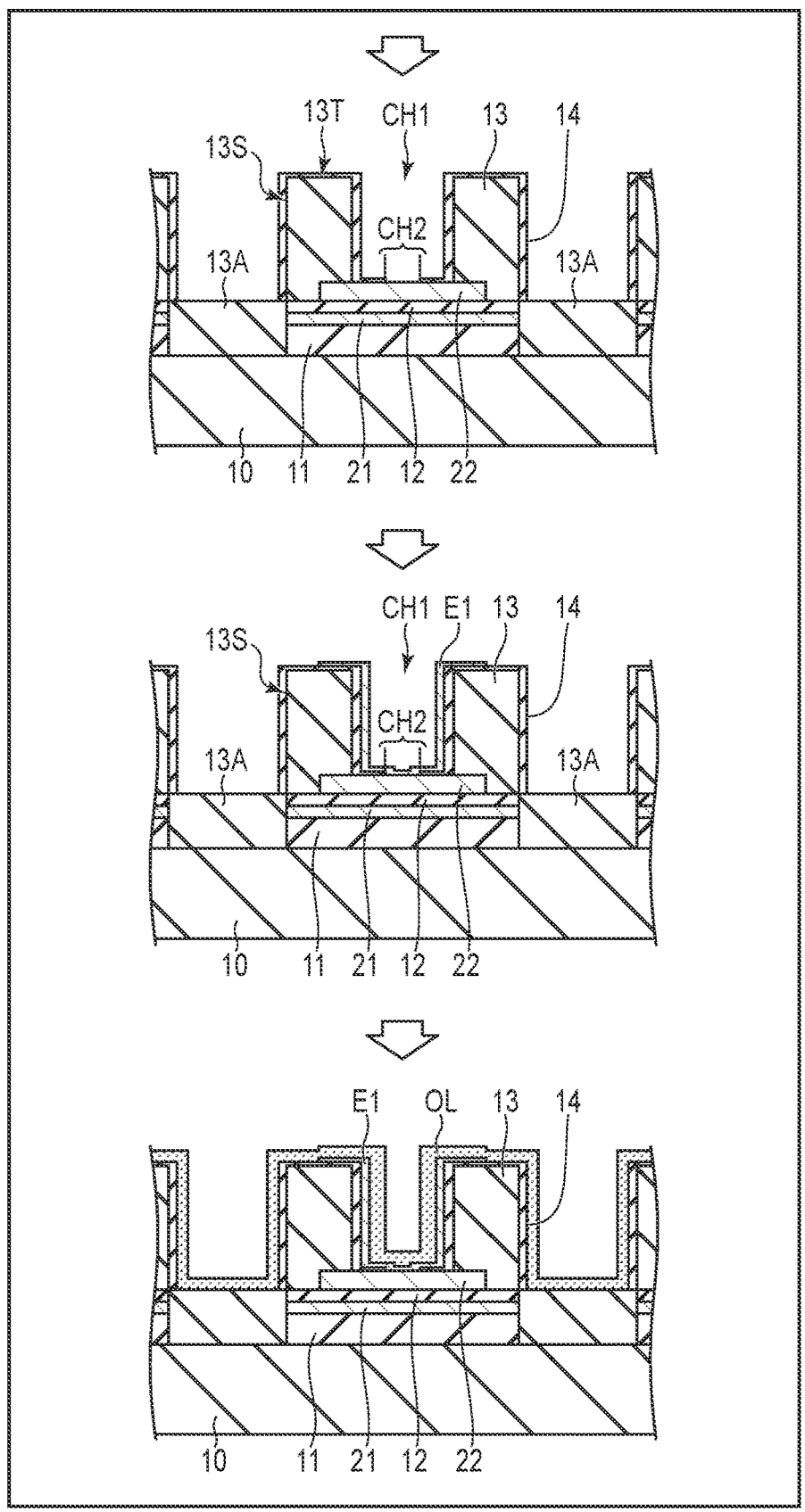
FIG. 7 is a diagram illustrating the method of manufacturing the flexible substrate 2.

Next, the barrier film 14 patterned in a predetermined shape is formed as shown in an upper part of FIG. 7. The barrier film 14 is formed to cover the entire organic insulating film 13 including the upper surface 13T and the side surfaces 13S. When patterning the barrier film 14, the contact hole CH2 penetrating to the second wiring layer 22 is formed. At this time, the organic insulating film 13A is exposed from the barrier film 14.

After that, the lower electrode E1 patterned in a predetermined shape is formed as shown in a middle part of the figure. The lower electrode E1 is formed to be brought into contact with the second wiring layer 22 at the contact hole CH2.

After that, the organic photoelectric conversion layer OL is formed over the entire surface as shown in a lower part of the figure.

Figure 8:
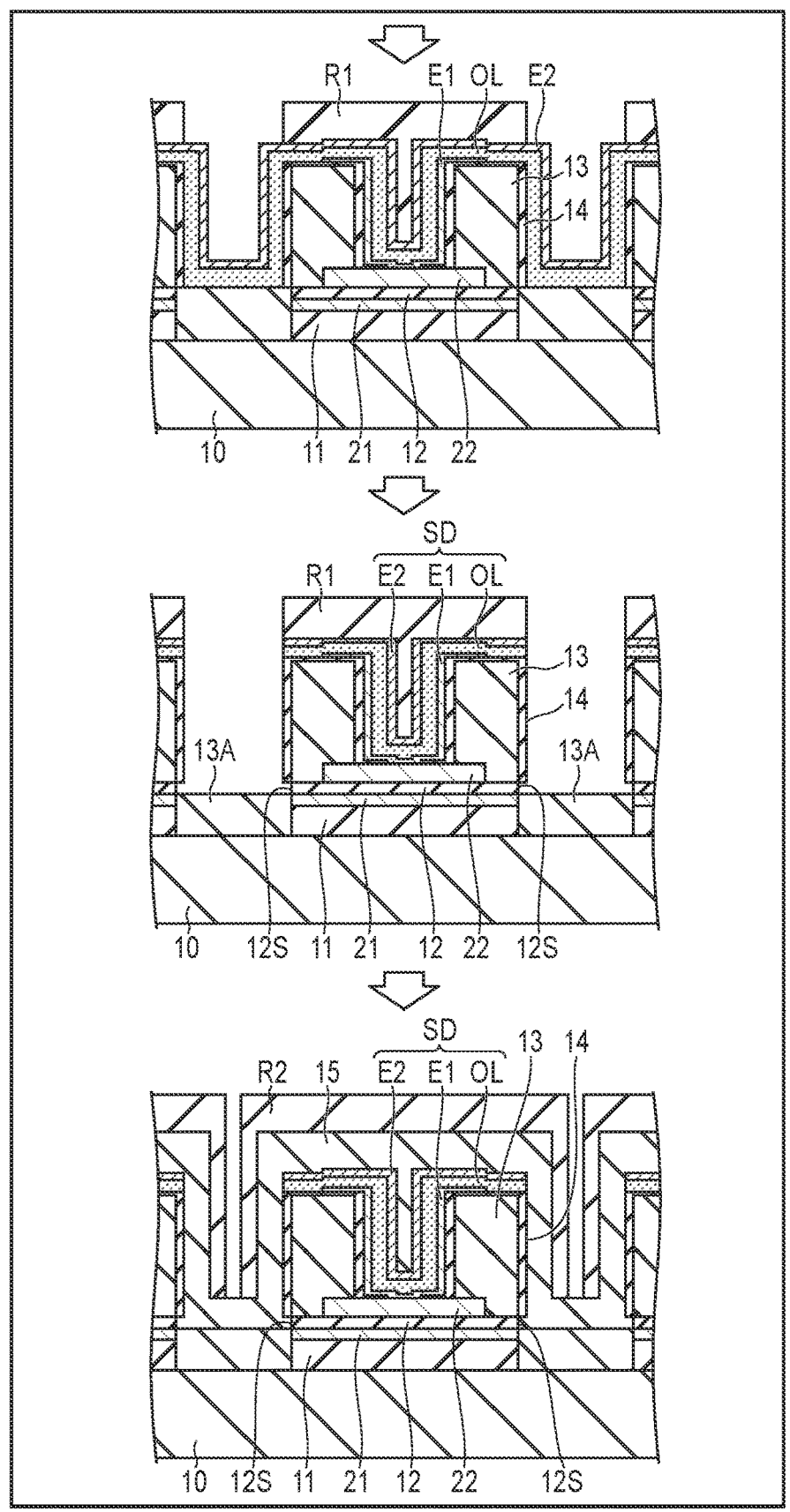
FIG. 8 is a diagram illustrating the method of manufacturing the flexible substrate 2.

Next, as shown in an upper part of FIG. 8, the upper electrode E2 is formed over the entire surface of the organic photoelectric conversion layer OL, and the resist R1 patterned in a predetermined shape is formed on the upper electrode E2.

After that, by using the resist R1 as a mask, the upper electrode E2 exposed from the resist R1 is removed by etching, and the organic photoelectric conversion layer OL exposed from the upper electrode E2 is removed by oxygen plasma treatment or ashing treatment, as shown in a middle part of the figure. At this time, the upper layer of the organic insulating film 13A, which serves as the base layer of the organic photoelectric conversion layer OL between the adjacent first inorganic insulating films 11, is also removed. The side surfaces 12S of the second inorganic insulating film 12 are exposed due to thinning of the organic insulating film 13A.

After that, the resist R1 is removed, the sealing film 15 is formed over the entire surface, and the resist R2 patterned in a predetermined shape is formed on the sealing film 15, as shown in a lower part of the figure. The sealing film 15 is formed to cover the sensor element SD and the barrier film 14 and to be brought into contact with the side surfaces 12S of the second inorganic insulating film 12.

Figure 9:
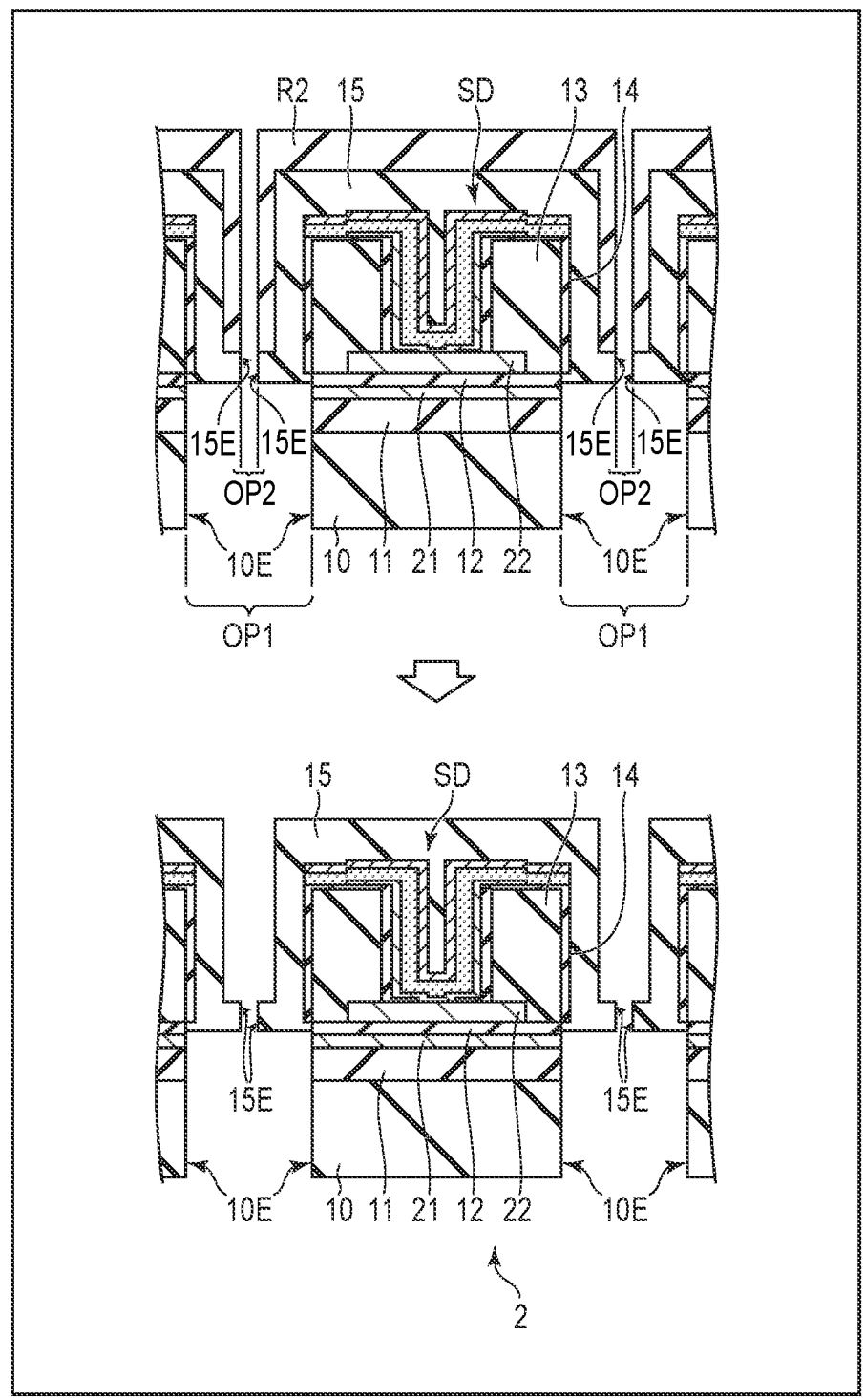
FIG. 9 is a diagram illustrating the method of manufacturing the flexible substrate 2.

Next, as shown in an upper part of FIG. 9, by using the resist R2 as a mask, the sealing film 15 exposed from the resist R2 is removed, the organic insulating film 13A exposed from the sealing film 15 is removed, and the insulating base 10 exposed from the organic insulating film 13A is removed. As a result, the first opening OP1 defined by the outer edge 10E of the insulating base 10 and the second opening OP2 defined by the outer edge 15E of the sealing film 15 are formed as shown in FIG. 5.

After that, the resist R2 is removed and the flexible substrate 2 is manufactured as shown in a lower part of the figure.

As described above, according to the embodiment, a sensor device capable of suppressing reduction in reliability can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A sensor device comprising:
an insulating base including a meandering strip-shaped portion and an island-shaped portion connected to the strip-shaped portion;
a first inorganic insulating film disposed on the island-shaped portion;
a first wiring layer disposed on the first inorganic insulating film;
a second inorganic insulating film disposed on the first wiring layer;
a second wiring layer disposed on the second inorganic insulating film;
an organic insulating film disposed on the second wiring layer;
a barrier film formed of an inorganic insulating material and covering the organic insulating film;
a sensor element disposed on the barrier film; and
a sealing film formed of an inorganic insulating material and covering the sensor element, wherein
the sensor element is an organic photodiode,
the barrier film covers side surfaces of the organic insulating film, and the sealing film is in contact with the barrier film and the second inorganic insulating film outside the sensor element.

2. The sensor device of claim 1, wherein
the sensor element comprises:
a lower electrode disposed on the barrier film;
an organic photoelectric conversion layer disposed on the lower electrode and being in contact with the barrier film outside the lower electrode; and
an upper electrode disposed on the organic photoelectric conversion layer, and
the sealing film covers the upper electrode and is in contact with side surfaces of the organic photoelectric conversion layer.

3. The sensor device of claim 2, wherein
the first inorganic insulating film, the second inorganic insulating film, the organic insulating film, the barrier film, and the sealing film extend above the strip-shaped portion,
the organic photoelectric conversion layer and the upper electrode extend above the barrier film overlapping the strip-shaped portion,
the lower electrode is not disposed directly above the strip-shaped portion, and
the sealing film covers the upper electrode overlapping the strip-shaped portion and is in contact with side surfaces of the organic photoelectric conversion layer.

4. The sensor device of claim 1, wherein the insulating base includes a first opening surrounded by the strip-shaped portion,
the sealing film includes a second opening overlapping the first opening in planar view, and
an area of the second opening is smaller than an area of the first opening.

5. The sensor device of claim 4, wherein
an outer edge of the sealing film overlaps the first opening in planar view, and
a width from an outer edge of the insulating base to the outer edge of the sealing film is 2.5 µm or more.

6. The sensor device of claim 1, wherein the barrier film and the sealing film are formed of silicon nitride or aluminum oxide.

* * * * *